(12) United States Patent
Oumiya et al.

(10) Patent No.: US 6,781,902 B2
(45) Date of Patent: Aug. 24, 2004

(54) SEMICONDUCTOR MEMORY DEVICE AND METHOD OF TESTING SHORT CIRCUITS BETWEEN WORD LINES AND BIT LINES

(75) Inventors: Atsuo Oumiya, Kitahiroshima (JP); Kouta Tanaka, Tokyo (JP); Naoki Handa, Chitose (JP); Kenji Kobayashi, Sapporo (JP)

(73) Assignees: Renesas Technology Corp., Tokyo (JP); Renesas Northern Japan Semiconductor, Inc., Hokkaido (JP); Hitachi Device Engineering Co., Ltd., Chiba (JP)

( * ) Notice: Subject to any disclaimer, the term of this patent is extended or adjusted under 35 U.S.C. 154(b) by 0 days.

(21) Appl. No.: 10/614,799

(22) Filed: Jul. 9, 2003

(65) Prior Publication Data

US 2004/0042279 A1 Mar. 4, 2004

(30) Foreign Application Priority Data

Aug. 28, 2002 (JP) ........................................ 2002-249097

(51) Int. Cl.[7] .............................................. G11C 29/00
(52) U.S. Cl. ........................ 365/201; 365/104; 365/103; 365/230.06
(58) Field of Search ................................ 365/104, 103, 365/201, 230.04, 230.06

(56) References Cited

U.S. PATENT DOCUMENTS

| | | | |
|---|---|---|---|
| 5,615,164 A | 3/1997 | Kirihata et al. | 365/230.06 |
| 5,619,460 A | 4/1997 | Kirihata et al. | 365/201 |
| 5,657,282 A | 8/1997 | Lee | 365/201 |
| 5,808,949 A | * 9/1998 | Arimoto | 365/201 |
| 5,905,690 A | * 5/1999 | Sakurai et al. | 365/233 |
| 5,963,491 A | * 10/1999 | Arimoto | 365/201 |
| 6,055,200 A | * 4/2000 | Choi et al. | 365/201 |
| 6,084,808 A | 7/2000 | Lim et al. | 365/201 |
| 6,651,196 B1 | * 11/2003 | Iwase et al. | 714/724 |

FOREIGN PATENT DOCUMENTS

| | | | |
|---|---|---|---|
| JP | 07-262798 | 10/1995 | ........... G11C/29/00 |
| JP | 08-273394 | 10/1996 | ........... G11C/29/00 |
| JP | 08-339696 | 12/1996 | ........... G11C/29/00 |
| JP | 08-339699 | 12/1996 | ........... G11C/29/00 |
| JP | 11-238397 | 8/1999 | ........... G11C/29/00 |

* cited by examiner

*Primary Examiner*—Andrew Q. Tran
(74) *Attorney, Agent, or Firm*—Miles & Stockbridge P.C.

(57) ABSTRACT

The present invention provides a semiconductor device and a testing method capable of easily detecting a short circuit in a memory circuit with high precision and efficiently detecting a short circuit in a memory circuit. A memory circuit in which memory cells are disposed at intersections of a plurality of word lines and a plurality of bit lines performs, in a test mode, an operation of applying a predetermined potential to neighboring ones of a plurality of word lines or bit lines, an operation of selecting a plurality of word lines and applying a ground potential of the circuit to all of the plurality of bit lines, and an operation of setting all of the plurality of bit lines at a predetermined potential corresponding to the selection level of the word lines and setting all of the plurality of word lines into a non-selection state. By measuring current flowing in a power supply terminal of the semiconductor device, a short circuit between word lines, a short circuit between bit lines, a short circuit between a word line and a bit line, and the like are detected.

9 Claims, 10 Drawing Sheets

SEMICONDUCTOR MEMORY DEVICE AND METHOD OF TESTING SHORT CIRCUITS BETWEEN WORD LINES AND BIT LINES

BACKGROUND OF THE INVENTION

The present invention relates to a semiconductor device and a testing method and relates to, for example, a technique effective for use in a technique of testing a one-chip microcomputer having therein a memory circuit.

By investigation of known arts made after the present invention has been achieved, the following disclosed techniques are reported as techniques related to the present invention. Japanese Unexamined Patent Publication Nos. Hei 8(1996)-339696 and Hei 8(1996)-339699 disclose a dynamic RAM in which all of word lines are selected or word lines are alternately selected to apply a stress on a word line. Japanese Unexamined Patent Publication No. Hei 11(1999)-238397 discloses a memory in which odd-numbered (or even-numbered) or all of word lines can be selected at the time of burn-in. Japanese Unexamined Patent Publication No. Hei 7 (1995)-262798 discloses a memory in which a stress can be applied to all of word lines or every other word line. Japanese Unexamined Patent Publication No. Hei 8 (1996)-273394 discloses a memory in which a stress is applied between neighboring word lines and, after that, a stress is applied to all of word lines.

SUMMARY OF THE INVENTION

In a one-chip microcomputer having a mask ROM (Read Only Memory) or the like in which important data such as a program is stored, when the mask ROM has a defect, an error occurs in a data process or the like and the whole becomes defective. Particularly, in a one-chip microcomputer requested to have high reliability such as one for a vehicle, it is important to assure reliability of the mask ROM to assure high reliability. In the mask ROM of the one-chip microcomputer, if a defect such as a short circuit exists in word lines and bit lines, basically, the defect can be detected as a read error. For example, as shown in FIG. 12, when short circuits shown as resistance exist in bit lines B1 and B2 and word lines W1 and W2, the defects of the short circuits can be detected as read errors at the time of selecting the bit line B1 or word line W1 at the time of changing a read address.

However, when the defect of the short circuit is uncertain, that is, when a short circuit having a relatively large resistance value exists in the word lines and bit lines, there are a case where a read error is detected and a case where a read error is not detected when the bit line B1 or word line W1 as shown in FIG. 12 is selected. Consequently, to detect such an uncertain defect of a short circuit as described above, there are problems such that the number of combinations of testing conditions (measured voltage, temperature, and the like) for detection in testing increases. Moreover, a defect which occurs once in a plurality of times of reading operations under the same test conditions cannot be detected with reliability even testing is made for long time.

An object of the invention is to provide a semiconductor device and a testing method capable of easily detecting a short circuit in a memory circuit with high precision. Another object of the invention is to provide a semiconductor device and a testing method capable of efficiently detecting a short circuit in a memory circuit. The above and other objects and novel features of the invention will become apparent from the description of the specification and appended drawings.

A representative one of inventions disclosed in the specification will be described briefly as follows. A memory circuit in which memory cells are disposed at intersections of a plurality of word lines and a plurality of bit lines performs, in a test mode, an operation of applying a predetermined potential to neighboring ones of a plurality of word lines or bit lines, an operation of selecting a plurality of word lines and applying a ground potential of the circuit to all of the plurality of bit lines, and an operation of setting all of a plurality of bit lines at a predetermined potential corresponding to the selection level of the word lines and making all of the plurality of word lines into a non-selection state. By measuring current flowing in a power supply terminal of the semiconductor device, a short circuit between word lines, a short circuit between bit lines, a short circuit between a word line and a bit line, and the like are detected.

DETAILED DESCRIPTION OF THE PREFERRED EMBODIMENTS OF THE INVENTION

Figure 1:
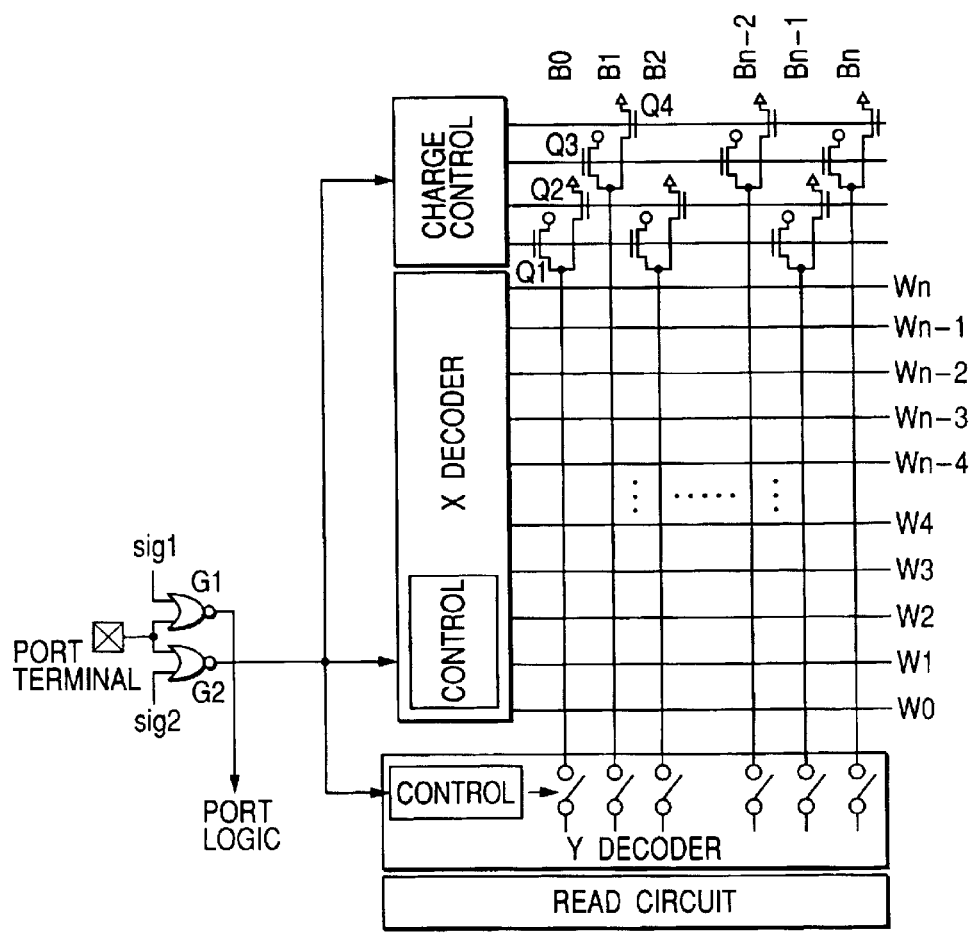
FIG. 1 is a block diagram showing an example of a memory circuit mounted on a semiconductor device according to the invention.

FIG. 1 is a block diagram showing an example of a memory circuit such as a mask ROM (Read Only Memory) mounted on a semiconductor device according to the invention. In the memory circuit of the embodiment, a memory array is constructed by disposing memory cells at intersections of word lines W0 to W4 and Wn−4 to Wn and bit lines B0 to B2 and Bn−2 to Bn. In the diagram, although all of memory cells are not shown, the memory cell is constructed by an MOSFET whose gate is connected to a word line and whose source-drain path is connected between a bit line and a ground potential of the circuit. The MOSFET performs operation of whether memory current is passed between the bit line and the ground potential of the circuit in accordance with storage information with respect to a selection level of the word line.

The storage information of the memory cell forms two states; a state where memory current flows from the bit line via the MOSFET, and a state where the memory current does not flow, in accordance with the word line selecting operation as described above by, for example, generating a high threshold voltage and a low threshold voltage of the MOSFET with respect to the selection level of the word line, selectively generating a contact for connecting a drain of the MOSFET and a bit line, or selectively generating a contact for connecting a word line and a gate of the MOSFET.

A means of generating a high threshold voltage and a low threshold voltage of the MOSFET with respect to the word line selection level is realized by forming a thick gate insulating film and a thin gate insulating film of the MOSFET or by changing concentration of an impurity in a channel region under a gate electrode by ion implantation technique. Selective formation of the contact which connects the word line and the gate of the MOSFET can be realized by forming a word line by using a wiring layer different from a gate electrode of the MOSFET.

An X decoder generates a word line selection signal for selecting one word line from the plurality of word lines W0 to Wn. A Y decoder selects one bit line from the plurality of bit lines B0 to Bn and leads a read signal of the bit line to a read circuit including a sense amplifier.

In the embodiment, to detect efficiently, in short time and, moreover, with high precision, a short circuit between word lines in the memory array, a short circuit between bit lines, a short circuit between a word line and a bit line, a short circuit between a word line and the substrate, a short circuit between a bit line and the substrate, and the like, each of the X and Y decoders is provided with a control circuit for performing operation of selecting a word line or bit line for test, which is different from a normal reading operation. For the bit lines, a charge control circuit and a charge MOSFET and a discharge MOSFET which are controlled by the charge control circuit are provided. In the diagram, circuit signs Q1 to Q4 are designated to representative MOSFETS provided for the bit lines B0 and B1.

For setting a test mode, an external (PORT) terminal and gate terminals G1 and G2 are provided to control the operation of the control circuit, charge control circuit, and a logic circuit (PORT LOGIC). For example, in a normal operation mode as a user mode, a signal sig1 is set to logic 0 and a signal sig2 is set to logic 1. In a test mode, the signal sig1 is set to logic 1 and the signal sig2 is set to logic 0. In the test mode, a plurality of test operations as will be described later can be performed in accordance with the logic 1 and logic 0 of the PORT terminal.

The control circuit provided in the X decoder enables all of word lines or every other word line to be selected. The switch MOSFETs Q1 to Q4 for enabling a bit line to be charged or discharged have the same current driving ability as that of MOSFETs used for memory cells in order to prevent the layout area from being increased. That is, a MOSFET having the same structure as that in a memory cell is used as a charge/discharge switch cell. In the switch MOSFETs Q1 to Q4, to charge/discharge every other bit line like a word line, the gates of the MOSFETs for charging/discharging even-numbered bit lines such as bit lines B0, B2, and Bn−1 are commonly connected. The gates of the MOSFETs for charging/discharging odd-numbered bit lines such as bit lines B1, Bn−2, and Bn are commonly connected.

To interrupt passage of a leak current to the read circuit at the time of charging the bit line, the control circuit provided in the Y decoder generates a control signal to make a bit line selecting switch (column switch) open. By using N-channel MOSFETs as the switch MOSFETs Q1, Q3, and the like for charging the bit lines, overcharging to a bit line is prevented, and compatibility with a voltage applied to a bit line from the read circuit in the user mode is maintained. That is, in the normal reading operation, current is supplied by a load MOSFET in the form of an N-channel MOSFET from the read circuit. The high or low level is sensed according to the presence/absence of current flowing in a memory cell.

Figure 2:
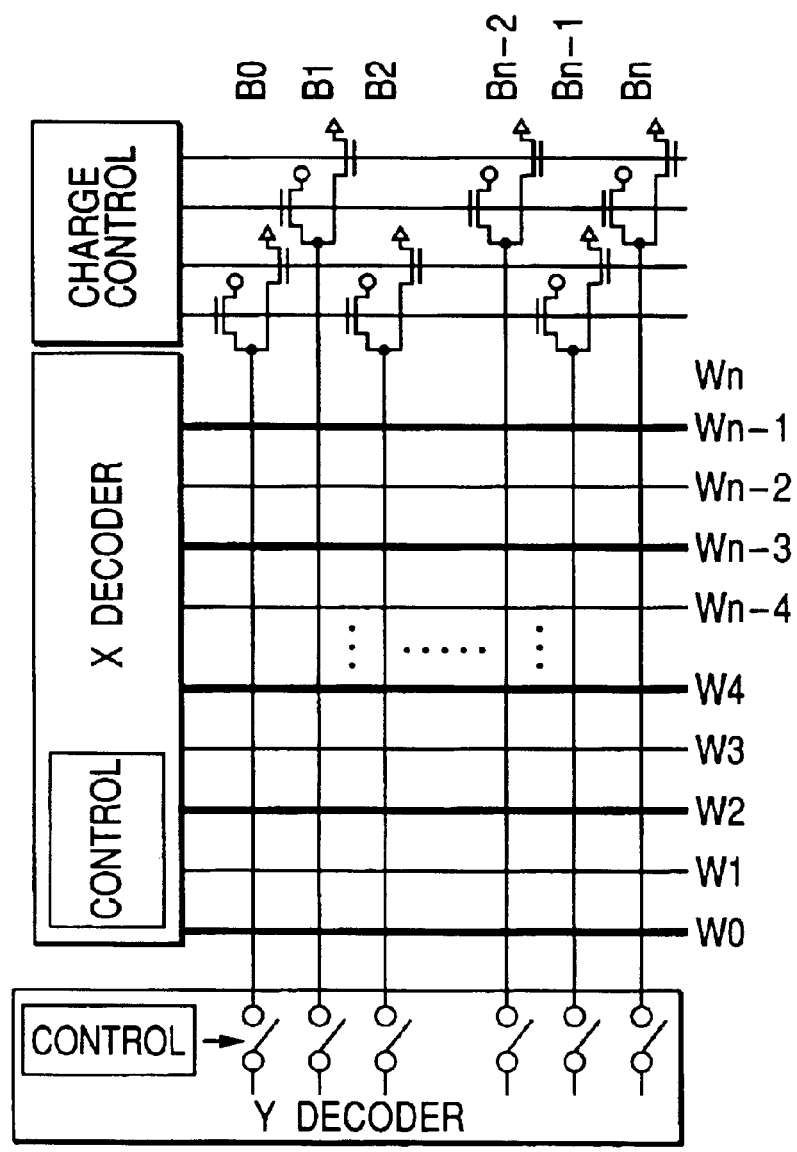
FIG. 2 is a circuit diagram for explaining an example of an operation of testing the memory circuit of FIG. 1.

FIG. 2 is a circuit diagram for explaining an example of an operation of testing the memory circuit of FIG. 1. In the diagram, a high voltage and a low voltage are applied alternately to the word lines W0 to Wn so that the word lines W0, W2, W4, . . . Wn−3, and Wn−1 in the word lines W0 to Wn are set to the selection level (high level) as shown by thick lines, and the word lines W1, W3, Wn−4, Wn−2, and Wn are set to the non-selection level (low level) as shown by thin lines. With such a configuration, a short circuit which occurs between neighboring word lines can be detected.

At this time, all of the bit lines B0 to Bn are set to the low level as shown by the thin lines and all of the column switches for performing an operation of selecting the bit lines B0 to Bn are turned off. To set the bit lines to the low level, the MOSFETs Q2, Q4, and the like for discharging provided for the bit lines B0 to Bn are turned on. To detect a short circuit between word lines, it is indispensable to set the bit lines B0 to Bn to the low level and turn off all of column switches for the following reason.

When a MOSFET in the on state exits in even one of the word lines W0, W2, W4, . . . , Wn−3, and Wn−1 at the high level (usually, in the mask ROM, information such as a program is stored, so that the probability that all of memory cells connected to the word lines W0, W2, W4, . . . Wn−3, and Wn−1 is in the off state is almost zero), a memory current is not passed to any of the bit lines B0 to Bn. When any one of bit lines is connected to the read circuit via a column switch, current flowing into the bit line exists. Consequently, to interrupt the current, all of the column switches are turned off. With the configuration, by measuring the current flowing to a power supply terminal of the semiconductor device including the memory circuit, a leak current corresponding to a short circuit between the word lines can be detected.

Figure 3:
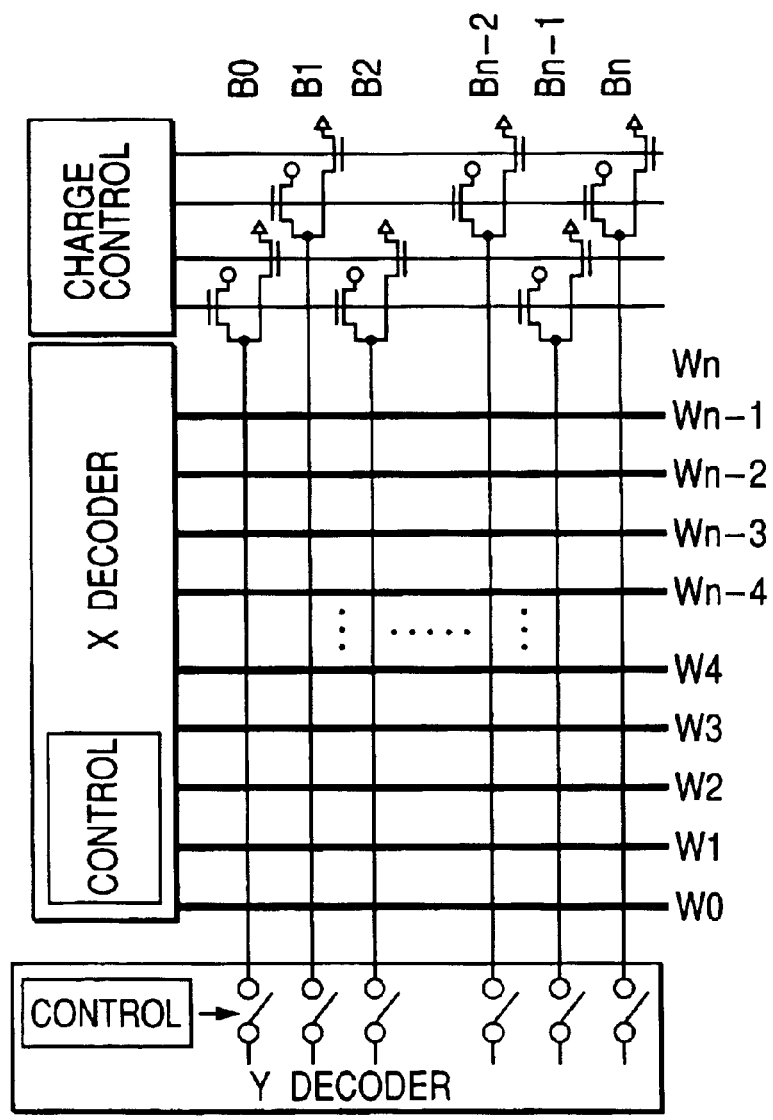
FIG. 3 is a circuit diagram for explaining another example of the operation of testing the memory circuit of FIG. 1.

FIG. 3 is a circuit diagram for explaining another example of the operation of testing the memory circuit of FIG. 1. In FIG. 3, all of the word lines W0 to Wn are set to the selection level (high level) as shown by thick lines. All of the bit lines B0 to Bn are set to the low level as shown by thin lines in a manner similar to FIG. 2 and all of column switches are turned off. Consequently, even when a memory cell which is turned on according to the selection level of the word line exists, without being influenced by the memory cell, a short circuit between a word line and a bit line or a short circuit between a word line and the substrate can be detected by measuring a current flowing in the power source terminal. In other words, by applying high voltage to all of word lines and applying low voltage to all of bit lines as shown in FIG. 3, a short circuit between a word line and the substrate, a short circuit between a word line and a memory drain, a short circuit between a word line and a memory source, and a short circuit between a word line and a bit line can be detected.

Figure 4:
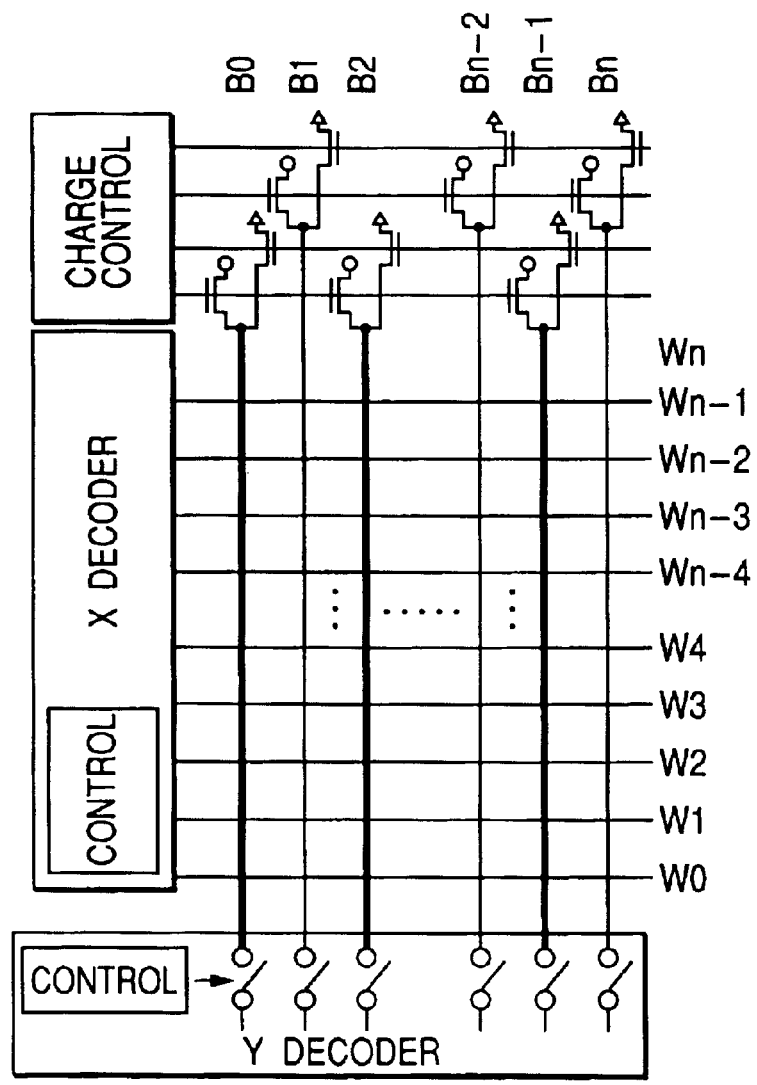
FIG. 4 is a circuit diagram for explaining another example of the operation of testing the memory circuit of FIG. 1.

FIG. 4 is a circuit diagram for explaining another example of the operation of testing the memory circuit of FIG. 1. In FIG. 4, a high voltage and a low voltage are applied alternately to the bit lines B0 to Bn so that the bit lines B0, B2, ..., and Bn−1 are set to the high level as shown by thick lines and the bit lines B1, ..., Bn−2, and Bn are set to the low level (ground potential of the circuit) as shown by thin lines. With the configuration, the MOSFETs for charging and discharging provided for the bit lines B0 to Bn are divided into two groups, and the high/low level is set on the group unit basis by the charge control circuit. All of the word lines W0 to Wn are set to the low level corresponding to the non-selection level as shown by thin lines and all of column switches are turned off. It enables a short circuit between neighboring bit lines to be detected by measuring the current flowing in the power supply terminal in a manner similar to the above.

Figure 5:
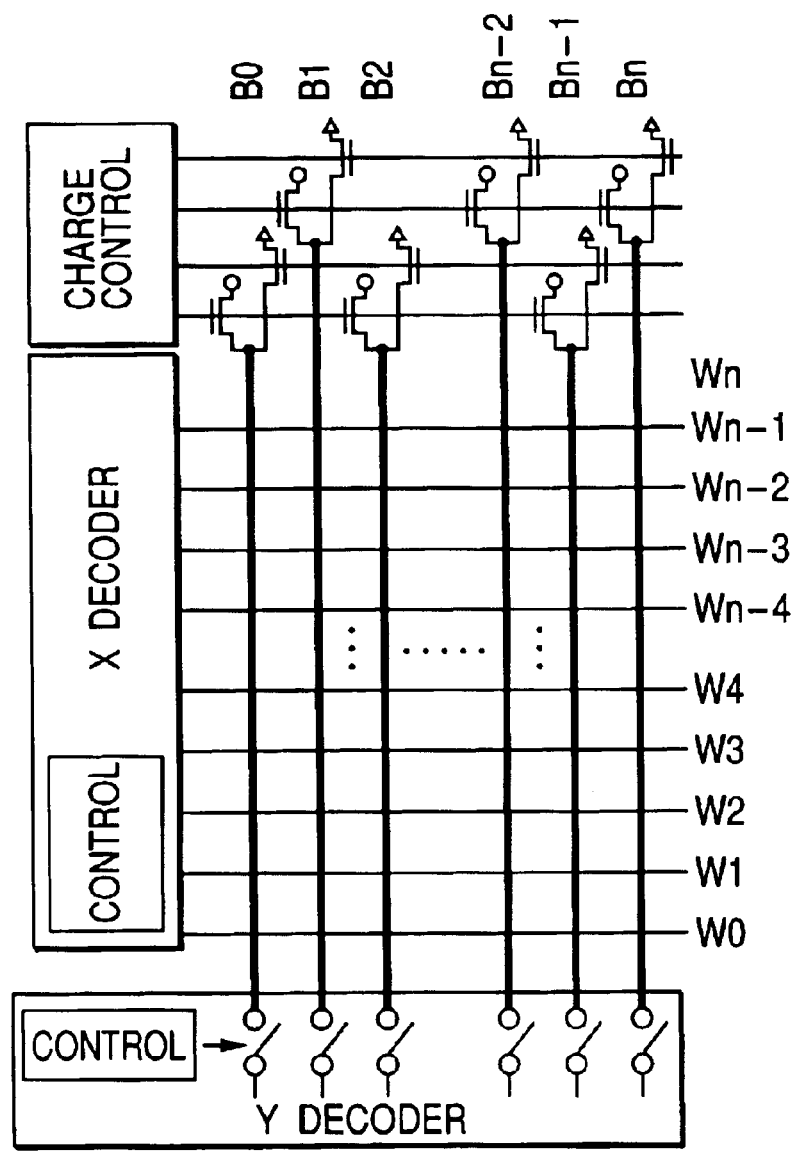
FIG. 5 is a circuit diagram for explaining another example of the operation of testing the memory circuit of FIG. 1.

FIG. 5 is a circuit diagram for explaining another example of the operation of testing the memory circuit of FIG. 1. In FIG. 5, all of bit lines B0 to Bn are set to the selection level (high level) as shown by thick lines. All of the word lines W0 to Wn are set to the low level as shown by thin lines in a manner similar to FIG. 4, and all of the column switch are turned off. With the configuration, even when a memory cell which is connected to the bit line that is set to the high level and is turned on according to the selection level of the word line exists, without being influenced by the memory cell, a short circuit between a bit line and a word line or a short circuit between a bit line and the substrate can be detected by measuring a current flowing in the power supply terminal. In other words, by applying high voltage to all of bit lines and applying low voltage to all of word lines as shown in FIG. 5, a short circuit between a bit line and the substrate and a short circuit between a memory drain and the substrate can be detected.

In the technique described in the publications, mainly, stress is applied on the circuit. By alternately setting, for example, only word lines to the selection/non-selection levels, the current flowing in the memory cell cannot be checked and a short circuit between word lines cannot be detected. Similarly, by alternately setting the bit lines to the high/low levels, the current flowing in the memory cell cannot be checked, and a short circuit between bit lines cannot be detected. Thus, the techniques described in the publications and the present invention are to be clearly discriminated from each other.

Figure 6:
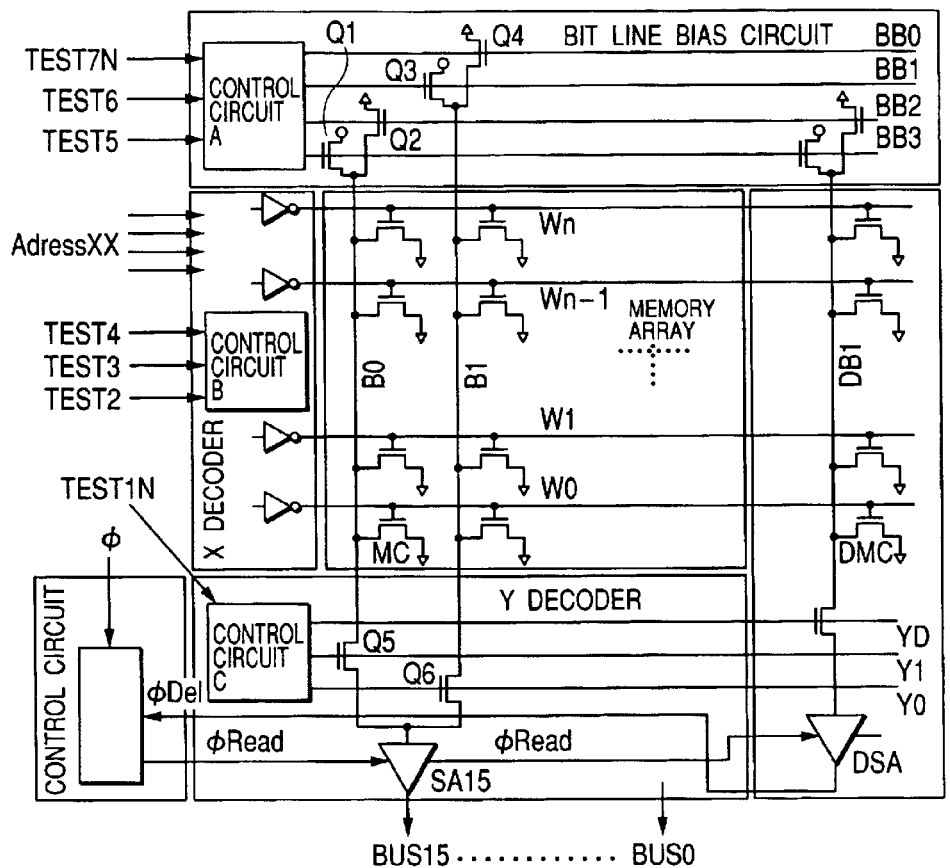
FIG. 6 is a schematic circuit diagram showing an example of a memory circuit mounted on the semiconductor device according to the invention.

FIG. 6 is a schematic circuit diagram showing an example of a memory circuit mounted on a semiconductor device according to the invention. The memory circuit of the example is basically similar to that of FIG. 1 and has, as a low power consumption control circuit, a dummy bit line DB1 and a dummy column switch and a dummy sense amplifier DSA corresponding to the dummy bit line DB1. A dummy cell DMC is turned on in correspondence with a selection level of each of the word lines W0 to Wn.

In the reading operation of the memory array, when one of the word lines W0 to Wn is selected, a memory current is always passed to the dummy cell DMC provided for the dummy bit DB1 and the low level is read. When the dummy sense amplifier DSA senses the low level transmits a read signal indicative of the low level to the control circuit, a sense activate signal φRead is changed from an active state to an inactive state. As a result, the operation time of a sense amplifier SA15 and the like can be set to the minimum, the direct current consumed by the sense amplifier is reduced and, therefore, lower power consumption is achieved.

Specifically, the sense amplifier activate signal φRead is set to the high level synchronously with the time when a timing signal φ is set to the high level by the control circuit, thereby activating the sense amplifier including the dummy sense amplifier DSA. By the activation of the sense amplifier, an operation of sensing a read signal from the selected bit line is performed. Since the dummy sense amplifier DSA generates a low-level read signal as described above, the read signal is transmitted to the control signal to set the sense amplifier activate signal φRead to the inactive state from the active state.

The memory array has MOSFETs constructing the memory cells at the intersections between the plurality of word lines W0 to Wn and the plurality of bit lines B0, B1 ... As the MOSFETs Q1 to Q4 and the like constructing the bit line bias circuit (the charting/discharging MOSFETs), N-channel MOSFETs having the same structure as that of the above-described MOSFETs are used, so that the layout area of the memory array can be prevented from being increased. Although not particularly limited, a read signal is output from the memory array on the unit basis of 16 bits. Consequently, 16 sense amplifiers are provided as SA0 to SA15. However, in the diagram, the sense amplifier SA15 as one of them is illustrated as a representative. The read signals of the sense amplifiers SA0 to SA15 are transmitted to a not-shown microprocessor via buses BUS0 to BUS15.

A control circuit A receives test signals TEST5, TEST6, and TEST7N and generates signals BB3 to BB0 to be supplied to the gates of the MOSFETs Q1 to Q4. By the signals, the operation of alternately setting the bit lines B0 to Bn to the selection level as shown in FIG. 4, the operation of setting all of the bit lines to the high level as shown in FIG. 5, and the operation of setting all of the bit lines to the low level as shown in FIGS. 2 and 3 are controlled.

A control circuit B provided for the X decoder receives test signals TEST2, TEST3, and TEST4 and controls the operation of alternately setting the word lines W0 to Wn to the selection level as shown in FIG. 2, the operation of setting all of the word lines to the selection level as shown in FIG. 3, and the operation of setting all of the word lines to the non-selection level as shown in FIGS. 4 and 5.

A control circuit C provided for the Y decoder receives a test signal TEST1N and controls the operation of turning off all of column switches including the dummy bit line DB1 as shown in FIGS. 2 to 6.

Figure 7:
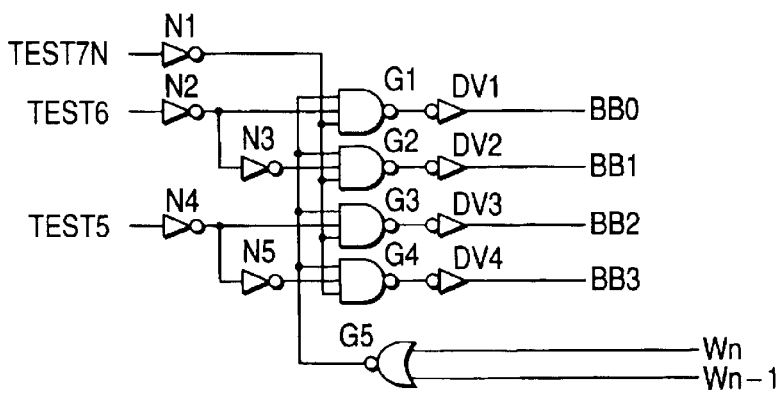
FIG. 7 is a circuit diagram showing an example of a control circuit A of FIG. 6.

FIG. 7 is a circuit diagram showing an example of the control circuit A in FIG. 6. In the example, the control circuit A is constructed by inverter circuits N1 to N5, NAND gate circuits G1 to G4 and drivers DV0 to DV3. The test signal TEST5 for performing control of charging/discharging odd-numbered bit lines instructs charging when it is at the high level and instructs discharging when it is at the low level. The test signal TEST6 for performing control of charging/discharging even-numbered bit lines instructs charging when it is at the high level and instructs discharging when it is at the low level. The test signal TEST7N is an enable signal of bit line potential control. When the test signal TEST7N is at the low level, the test mode is set.

When either the word line Wn or Wn−1 is at the high level, all of the control signals BB0 to BB3 are set to the low level in order to prevent the following situation. When a bias is applied to a bit line in a state where all of word lines are selected or high and low voltages are applied alternately to the word lines, current is passed to a plurality of memories selected and, according to a sum of the currents, circuit destruction or fusing of a line occurs. At the time of conducting a current test of the mask ROM, to prevent occurrence of a feed-through current between the sense amplifier and the bit line bias circuit, all of the switches in the Y decoder are turned off by the control circuit C.

Figure 8:
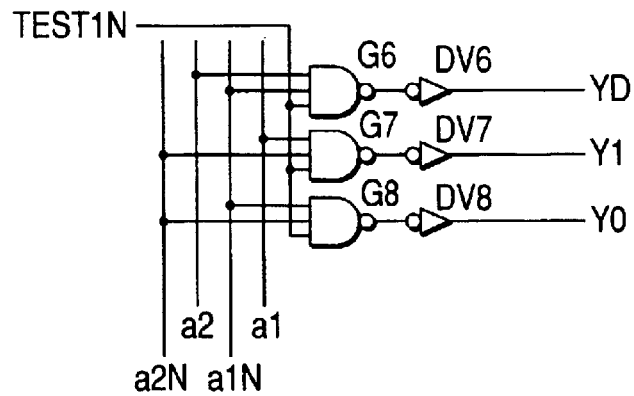
FIG. 8 is a circuit diagram showing an example of a control circuit C of FIG. 6.

FIG. 8 is a circuit diagram showing an example of the control circuit C of FIG. 6. In the example, the control circuit C is constructed by NAND gate circuits G6 to G8 and drivers DV6 to DV8 and generates column selection switches Y0, Y1, and YD. Out of four combinations of address signals a1 and a2 of two bits and inversion signals a1N and a2N, in the diagram, Y0, Y1, and YD are generated in two ways. The test signal TEST1N is supplied to such a Y decoder, and the Y decoder is activated when the test signal TEST1N is set to the high level, and is made inactive (all of the column switches are turned off) when the test signal TEST1N is set to the low level.

Figure 9:
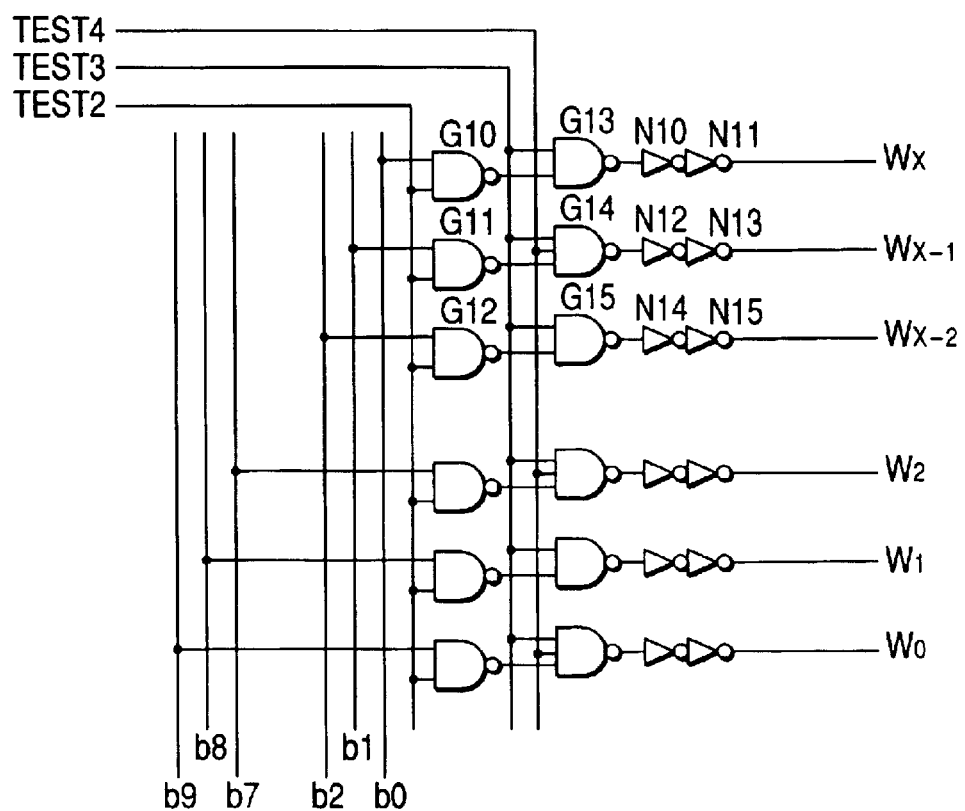
FIG. 9 is a circuit diagram showing an example of a control circuit B of FIG. 6.

FIG. 9 is a circuit diagram showing an example of the control circuit B in FIG. 6. In the example, the control circuit B is constructed by inverter circuits N10 to N15, NAND gate circuits G10 to G15, and the like. When the test signal TEST4 is set to the high level, the test signal TEST3 is set to the low level, and the test signal TEST2 is set to the high level, all of word lines are set to the selection level which is the high level. When the test signal TEST4 is set to the high level, the test signal TEST3 is set to the high level, and the test signal TEST2 is set to the low level, all of word lines are set to the non-selection level which is the low level. When the test signal TEST4 is set to the low level, the test signal TEST3 is set to the high level, and the test signal TEST2 is set to the low level, all of the word lines are alternately set to the high and low levels. When the test signal TEST4 is set to the high level, the test signal TEST3 is set to the high level, and the test signal TEST2 is set to the high level, one word line is set to the selection level which is the high level in accordance with a combination (not shown) of predecode signals b0 to b9 of X address signals illustrated.

Figure 10:
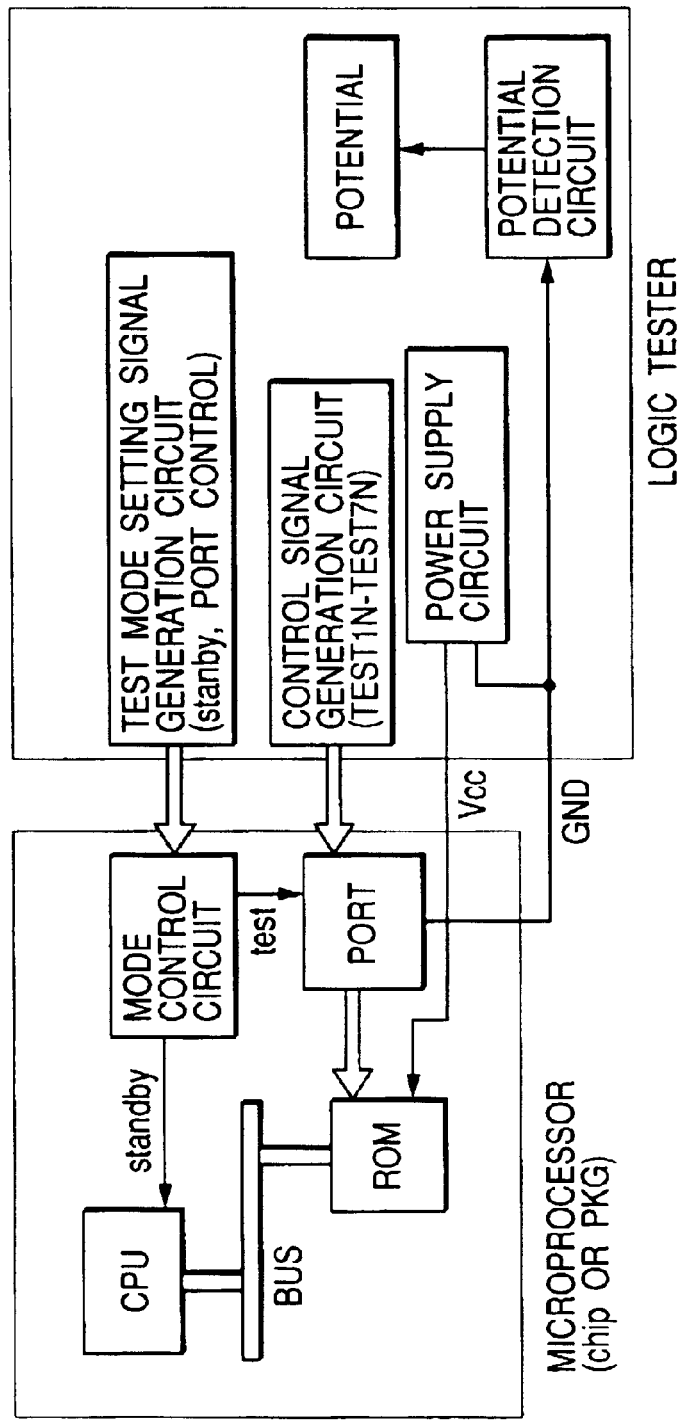
FIG. 10 is a block diagram for explaining a testing operation of the semiconductor device according to the invention.

FIG. 10 is a block diagram for explaining a testing operation of the semiconductor device according to the invention. The semiconductor device takes the form of a one-chip microprocessor including a central processing unit (or microprocessor) CPU and its peripheral circuits. In the embodiment, a ROM is illustrated as a representative of the peripheral circuits. According to a circuit function, a RAM for temporarily storing information, an input/output circuit (port), an A/D converter, a D/A converter, a serial interface circuit, and the like are provided but are not shown in the diagram.

The CPU and ROM are connected to each other via an internal bus BUS. In the ROM, in the normal operation mode, a control program or a plurality of instruction codes which are to be executed by the CPU are stored. The control program or the plurality of instruction codes are supplied to the CPU via the internal bus and are executed by the CPU. Related to the test circuit, a mode control circuit and a port (input circuit) are provided. Each of the semiconductor devices is in a chip state on a semiconductor wafer at the time of a probing test, and is assembled in a package (PKG) at the time of a final test. For such tests of the semiconductor device, a logic tester is used. The logic tester includes a test mode setting signal generation circuit, a control signal generation circuit, a power supply circuit, a potential detection circuit, and a potential determination circuit.

The test mode setting circuit makes the CPU standby and performs a port control. The control signal generation circuit controls the port and inputs the test signals TEST1N to TEST7N in the test mode. The power supply circuit supplies the power supply voltage Vcc and the ground potential GND of the circuit and also detects a current flowing in the power supply terminal. The potential detection circuit detects the potential of a read signal of the ROM or the like, and the potential determination circuit determines whether the potential is good or not with respect to an expectation value.

In the probing test, an electrode corresponding to an external terminal of the chip is electrically connected to the logic tester via a probe needle of a wafer prober. In the final inspection, the semiconductor device is inserted into a test substrate of the logic tester and is electrically connected. By the logic tester, the microprocessor is set in the test mode, and tests are conducted in accordance with order of a standby test, a ROM standby test, and an AC test.

Figure 11:
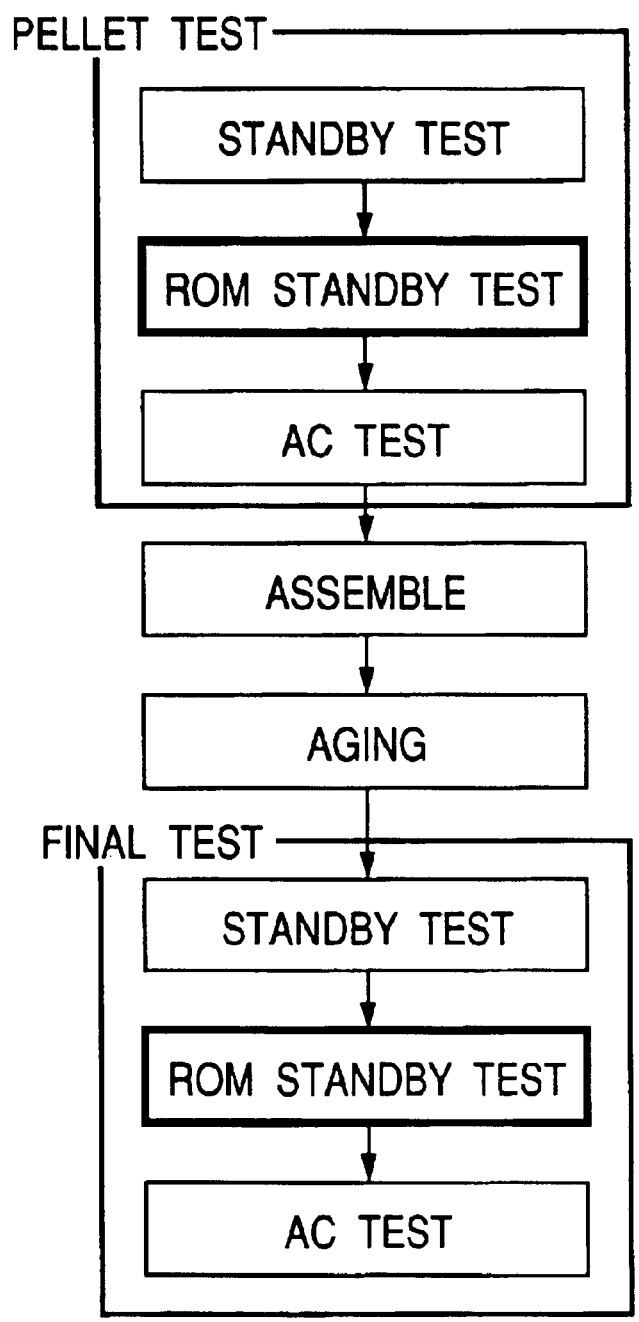
FIG. 11 is a flowchart for explaining a testing operation of the semiconductor device according to the invention.
Figure 12:
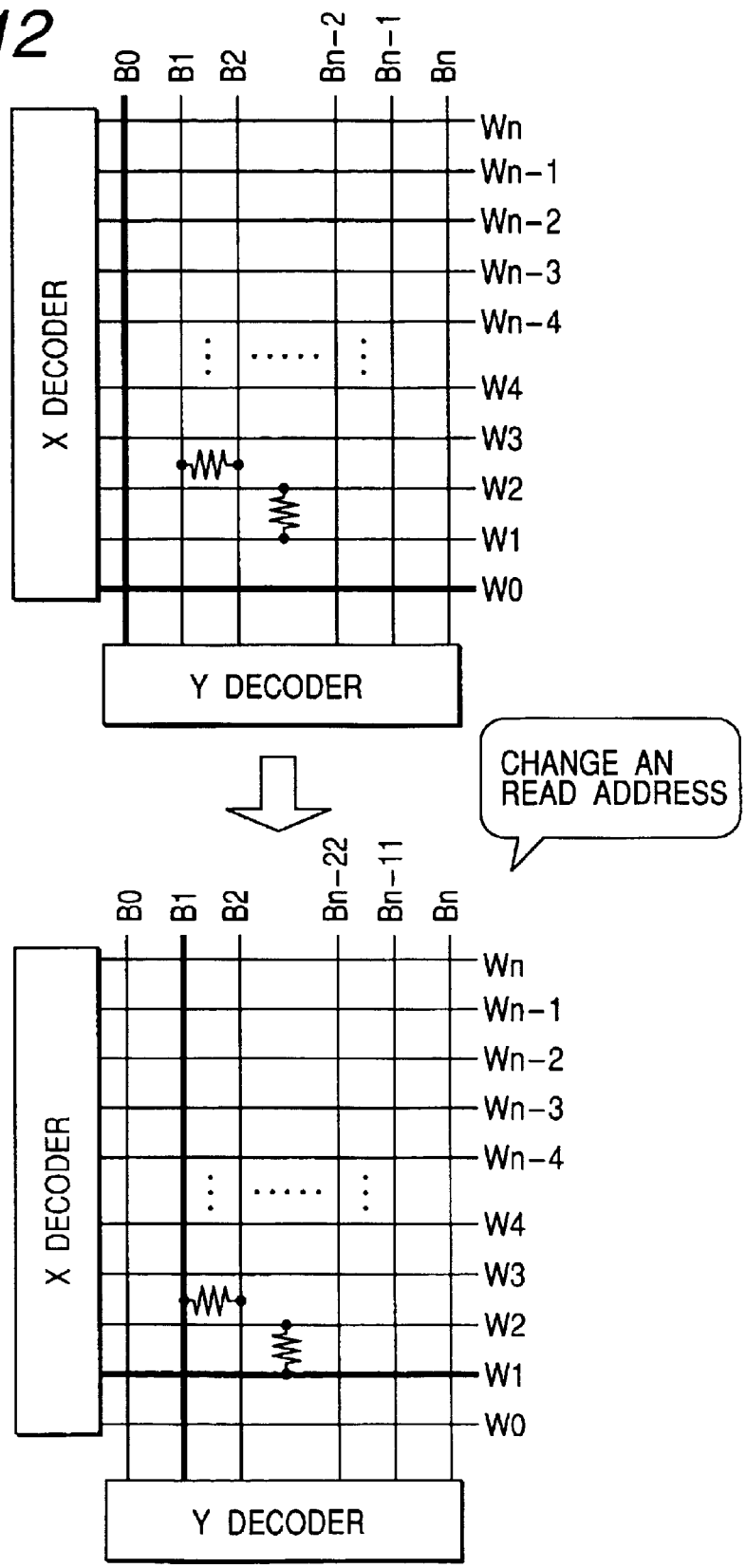
FIG. 12 is a circuit diagram for explaining a testing operation examined prior to the present invention.

FIG. 11 is a flowchart for explaining a testing operation of the semiconductor device according to the invention. The testing method according to the invention is applied to a P test (probing test) and a final inspection.

In the P test, a standby test is carried out. The standby test is a direct current test of the semiconductor device. An internal circuit is set in a standby state and a power supply current and a leak current at input and output terminals are measured. After that, the ROM standby test is conducted. In the ROM standby test, potentials of the word lines and bit lines are set as shown in FIGS. 2 to 5 and a leak current at a power supply terminal is measured. The measurement of a leak current is performed by the power supply circuit.

The determination of the leak current is performed, although not particularly limited, by using a leak current in the standby test as a reference. In each of the tests in FIGS. 2 to 5, all of the circuits such as the memory circuit and the microprocessor mounted on the semiconductor device are set to the standby mode and an increase in current to the non-defective device is measured. Specifically, when an increase in current to the non-defective device is measured, it is determined that a short circuit exists and the sample is determined as defective. Usually, in a non-defective device in a standby state, a current of only a few $\mu$A is measured. When a sample in which a current of tens $\mu$A is generated is determined as a defective, a short circuit having a resistance value of about 0.5 M$\Omega$ can be determined as a defective with reliability. Since there are only the operations in four ways as shown in FIGS. 2 to 5, the determination can be made in extremely short time.

Specifically, the ROM standby test is conducted on the device which is determined as a non-defective in the standby test. When the device is determined as a non-defective in the ROM standby test, the AC test is made. In the AC test, whether a ROM is good or not is determined by performing a reading operation and comparing the read value with an expected value. The AC test includes an operation test on not only the ROM but also the CPU and other peripheral circuits (not shown). For the AC test, a potential detection circuit and a potential determination circuit are used.

A chip determined as non-defective in the P test is assembled in a package and is subjected to aging. The aging is performed by operating the semiconductor device at high temperature to accelerate an initial defect and a chip in which a defect occurs is removed as a defective chip in the final inspection.

In the final inspection as well, a standby test is carried out first in a manner similar to the P test. A device which is determined as a non-defective in the standby test is subjected to a ROM standby test. In the ROM standby test, the potentials of the word lines and bit lines are set as shown in FIGS. 2 to 5 and a leak current at the power supply terminal is measured. A chip determined as a non-defective in the ROM standby test is subjected to the AC test. A chip which is determined as a non-defective is shipped.

By inserting the ROM standby test according to the invention between the standby test (direct current test) and the AC test, the AC test can be dedicated to check the operations. Consequently, a complicated test pattern for detecting a short circuit becomes unnecessary in the AC test and the test time of the AC test can be shortened. Thus, reliable testing can be carried out efficiently.

In the invention described above, a short circuit can be detected as a standby current in the ROM standby mode, so that a defect having a resistance value of about 0.5 MΩ can be also detected. Hitherto, in the case of analyzing a defect in a memory, a defective cell on a chip is specified on the basis of a defect address obtained in a read mode test by using a physical bit map which varies according to a product. By introducing the method of the invention, analysis of a defect is facilitated.

In product having a mask ROM, a customer's program is stored in the ROM, so that it is difficult to operate the ROM at the time of aging. Consequently, the testing operation shown in FIGS. 2 to 5 is performed at the time of aging. Thus, in addition to the operation only in the user mode, a bias can be applied alternately to all of the bit and word lines of the memory. The efficiency of the operation of the mask ROM at the time of aging can be also improved.

Although the invention achieved by the inventor herein has been concretely described above on the basis of the embodiment, the invention is not limited to the foregoing embodiment but can be variously modified without departing from the gist. The circuit configuration of setting the potentials of the word and bit lines of the ROM as shown in FIGS. 2 to 5 can be variously modified. The memory circuit is not limited to the ROM but may be an electrically writable and erasable nonvolatile memory such as a ROM or EEPROM. The invention can be widely applied to various semiconductor devices each including a memory circuit and the method of testing the same.

An effect obtained by a representative invention in the inventions disclosed in the specification will be briefly described as follows. A memory circuit in which memory cells are disposed at intersections of a plurality of word lines and a plurality of bit lines performs, in a test mode, an operation of applying a predetermined potential to neighboring ones of a plurality of word lines or bit lines, an operation of selecting a plurality of word lines and applying a ground potential of the circuit to all of the plurality of bit lines, and an operation of setting all of the bit lines at a predetermined potential corresponding to the selection level of the word lines and making all of the plurality of word lines into a non-selection state. By measuring current flowing in a power supply terminal of the semiconductor device, a short circuit between word lines, a short circuit between bit lines, a short circuit between a word line and a bit line, and the like are detected. Thus, a defect such as a short circuit can be detected with reliability in extremely short time.

What is claimed is:

1. A semiconductor device comprising:
   a plurality of word lines;
   a plurality of bit lines; and
   a memory circuit including a plurality of memory cells each connected to one of said plurality of word lines and one of said plurality of bit lines,
   wherein said memory circuit performs:
   an operation of selecting every other word line in said plurality of word lines in a first test mode;
   an operation of setting all of the plurality of word lines to a selected state and applying a ground potential of the circuit to all of said plurality of bit lines in a second test mode;
   an operation of applying a predetermined potential to every other bit line in the plurality of bit lines and applying a ground potential of the circuit to the other bit lines in a third test mode; and
   an operation of setting all of the plurality of bit lines at a predetermined potential corresponding to a selection level of the bit lines and setting all of said plurality of word lines to a non-selection state in a fourth test mode.

2. The semiconductor device according to claim 1, further comprising:
   a microprocessor for accessing said memory circuit and a mode control circuit,
   wherein a test mode is set to said mode control circuit, thereby setting the microprocessor into a standby mode and setting said memory circuit in any of said first to fourth test modes.

3. The semiconductor device according to claim 1, wherein said memory circuit is a mask ROM.

4. A method of testing a semiconductor device comprising a plurality of word lines, a plurality of bit lines, and a memory circuit including a plurality of memory cells each connected to one of said plurality of word lines and one of said plurality of bit lines, the method comprising:
   selecting every other word line in said plurality of word lines in a first test mode;
   setting all of the plurality of word lines to a selected state and applying a ground potential of the circuit to all of said plurality of bit lines in a second test mode;
   applying a predetermined potential to every other bit line in the plurality of bit lines and applying a ground potential of the circuit to the other bit lines in a third test mode;
   setting all of the plurality of bit lines at a predetermined potential corresponding to a selection level of the bit lines and setting all of said plurality of word lines to a non-selection state in a fourth test mode;
   measuring current passed to a power supply terminal of the semiconductor device in said first to fourth test modes and detecting a short circuit between word lines, a short circuit between bit lines, and a short circuit between a word line and a bit line.

5. The method of testing a semiconductor device according to claim 4,
   wherein said semiconductor device further comprises a microprocessor for accessing the memory circuit and a mode control circuit, and
   wherein the method further comprises:
   setting the microprocessor into a standby mode and setting said memory circuit in any of said first to fourth test modes by setting a test mode to said mode control circuit so that said current passed to said power supply terminal in accordance with each of the first to fourth test modes is measured.

6. The method of testing a semiconductor device according to claim 5, further comprising:
   conducting a direct current test on the semiconductor device at the time of a probe test of said semiconductor device; and
   conducting a direct current test on the semiconductor device,
   wherein said detection of a short circuit in any of said first to fourth test modes is performed on said memory circuit.

7. The method of testing a semiconductor device according to claim 6,
   wherein said detection of a short circuit of said memory circuit is conducted on said semiconductor device which is determined as a non-defective in the direct current test on said semiconductor device, and wherein an alternating current test is conducted on said memory circuit having no short circuit.

8. The method of testing a semiconductor device according to claim 7, wherein the semiconductor device subjected to said probe test is assembled and subjected to aging, thereafter, said direct current test is conducted on the semiconductor device, wherein said detection of a short circuit is performed in said first to fourth test modes on said memory circuit, and wherein said alternating current test is conducted on the semiconductor device.

9. The method of testing a semiconductor device according to claim 8, wherein said detection of a short circuit in said memory circuit is made on said semiconductor device which has been determined as non-defective in the direct current test, and wherein said alternating current test is conducted on said semiconductor device having no short circuit in said memory circuit.

* * * * *